United States Patent
Cho et al.

(10) Patent No.: US 8,535,547 B2
(45) Date of Patent: Sep. 17, 2013

(54) PRINTED CIRCUIT BOARD MANUFACTURING SYSTEM AND MANUFACTURING METHOD THEREOF

(75) Inventors: Chung-Woo Cho, Suwon-si (KR); Soon-Jin Cho, Suwon-si (KR); Byung-Bae Seo, Cheongju-si (KR); Ki-Young Yoo, Suwon-si (KR); Seok-Hwan Ahn, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 399 days.

(21) Appl. No.: 12/010,195

(22) Filed: Jan. 22, 2008

(65) Prior Publication Data

US 2009/0026169 A1    Jan. 29, 2009

(30) Foreign Application Priority Data

Jul. 25, 2007   (KR) ................. 10-2007-0074788

(51) Int. Cl.
*H01B 13/00*   (2006.01)
(52) U.S. Cl.
USPC .............. 216/17; 216/13; 216/18; 216/37; 313/631
(58) Field of Classification Search
USPC ............. 216/13, 17, 18, 37; 313/631
See application file for complete search history.

(56) References Cited

U.S. PATENT DOCUMENTS

| | | | |
|---|---|---|---|
| 4,711,026 A * | 12/1987 | Swiggett et al. | 29/850 |
| 5,347,462 A | 9/1994 | Okuda et al. | |
| 5,529,441 A | 6/1996 | Kosmowski et al. | |
| 6,297,458 B1 | 10/2001 | McMillan et al. | |
| 6,609,297 B1 | 8/2003 | Hiramatsu et al. | |
| 7,151,251 B2 * | 12/2006 | Kim et al. | 250/239 |
| 7,524,429 B2 * | 4/2009 | Hsu et al. | 216/18 |
| 2002/0050055 A1 | 5/2002 | Ishizaka | |
| 2003/0130826 A1 | 7/2003 | Nguyen | |
| 2004/0081351 A1 | 4/2004 | Ganot et al. | |
| 2005/0111206 A1 | 5/2005 | Borland et al. | |

(Continued)

FOREIGN PATENT DOCUMENTS

| CN | 1402716 A | 5/2003 |
|---|---|---|
| JP | 10-48835 A | 2/1998 |

(Continued)

OTHER PUBLICATIONS

Korean Office Action, mailed Jul. 28, 2008, and issued in corresponding Korean Patent Application No. 10-2007-0074788.

(Continued)

*Primary Examiner* — Nadine Norton
*Assistant Examiner* — Maki Angadi (57) ABSTRACT

A printed circuit board manufacturing system and a manufacturing method thereof are disclosed. A method of manufacturing printed circuit board, comprising: providing a substrate that comprises a pad and an insulation layer covering the pad; acquiring an image of the substrate; acquiring location information of the pad by analyzing the image of the substrate; forming a via hole by removing a part of the insulation layer that corresponds the location information of the pad; and forming a via by filling the via hole with a conductive material, provides improved process conformity, even if the substrate has partial or nonlinear deformation, by considering the location information of the pad in the via hole forming. The improved conformity may allow more flexibility to substrate design and more integrity for circuitries on printed circuit board.

2 Claims, 6 Drawing Sheets

(56) References Cited

U.S. PATENT DOCUMENTS

| | | | |
|---|---|---|---|
| 2006/0181218 A1* | 8/2006 | Jung et al. | 313/631 |
| 2007/0084823 A1 | 4/2007 | Hsu et al. | |
| 2008/0093560 A1* | 4/2008 | Puhakka et al. | 250/370.08 |
| 2009/0025966 A1 | 1/2009 | Shimoosako et al. | |

FOREIGN PATENT DOCUMENTS

| | | |
|---|---|---|
| JP | 11-267868 A | 10/1999 |
| JP | 2001-160677 | 6/2001 |
| JP | 2001-274076 | 10/2001 |
| JP | 2003-340587 | 12/2003 |
| JP | 2006-080216 A | 3/2006 |
| JP | 2007-81409 | 3/2007 |
| KR | 2001-0005137 | 1/2001 |
| KR | 2004-0005659 | 1/2004 |
| TW | 200527993 A | 8/2005 |
| TW | 200702162 A | 1/2007 |
| WO | 2006/093054 | 9/2006 |

OTHER PUBLICATIONS

Chinese Office Action mailed Apr. 15, 2010 and issued in corresponding Chinese Patent Application 200810083115.6.

Taiwanese Office Action issued Jun. 20, 2011 in corresponding Taiwanese Patent Application 097199245.

Japanese Office Action dated Apr. 27, 2010 and issued in corresponding Japanese Patent Application 2008-004906.

Japanese Office Action for corresponding Japanese Patent Application No. 2008-004906 dated Jan. 4, 2011.

U.S. Patent Office Action mailed Nov. 17, 2011 in U.S. Appl. No. 12/929,260.

Office Action for U.S. Appl. No. 12/929,260 issued Oct. 24, 2012.

U.S. Patent Office Action mailed May 30, 2012 in corresponding U.S. Appl. No. 12/929,260.

* cited by examiner

PRINTED CIRCUIT BOARD MANUFACTURING SYSTEM AND MANUFACTURING METHOD THEREOF

CROSS-REFERENCE TO RELATED APPLICATIONS

This application claims the benefit of Korean Patent Application No. 10-2007-0074788 filed with the Korean Intellectual Property Office on Jul. 25, 2007, the disclosure of which is incorporated herein by reference in its entirety.

BACKGROUND

1. Technical Field

The present invention relates to a printed circuit board manufacturing system and a manufacturing method thereof.

2. Description of the Related Art

Miniaturization of electronic device is accomplished by miniaturization of electronic parts. Miniaturization of electronic parts does not mean minimized function. Electronic parts must have same functions in limited size. For this, researches for larger integrity have been accomplished.

For larger integrity, structure of printed circuit board is improved from single-layered to multi-layered. Multi-layered printed circuit board may be manufactured by forming a circuit pattern substrate and then forming another circuit pattern substrate on it. Multi-layered printed circuit board may require interconnections between circuits on each substrate layers.

Figure 1:
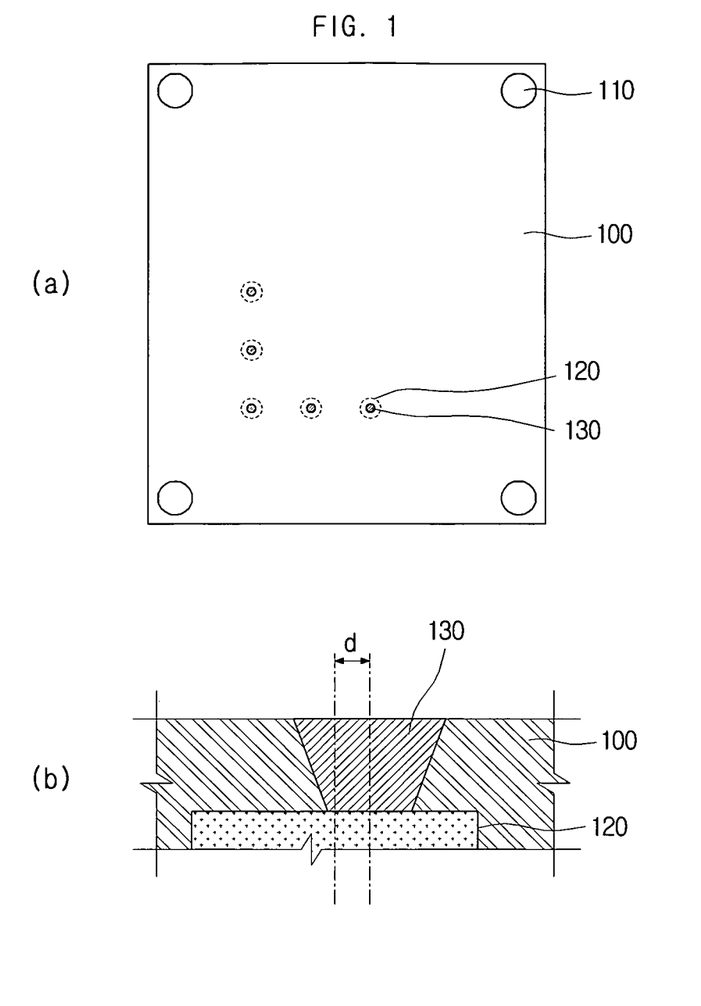
FIG. 1 is a front view and an enlarged cross-sectional view of printed circuit board according to prior art.

This interconnection may be provided by pads and vias. Connections between pads and vias will be described referring FIG. 1. FIG. 1 is a front view and an enlarged cross-sectional view of printed circuit board according to prior art. In FIG. 1 are illustrated an insulation plate 100, a fiducial mark 110, a pad 120 and a via 130.

Align distance between the pad 120 and the via 130 is notes as d. This align distance d is defined as distance between center of pad 120 and center of via 130. For large d, electronic connection between the pad 120 and the via 130 may not be guaranteed.

Guaranteeing the electronic connection between the pad 120 and the via 130 may require large-sized pad. This may be an obstruction for integration of circuitry on substrate, by limiting flexibility of substrate design.

Figure 2:
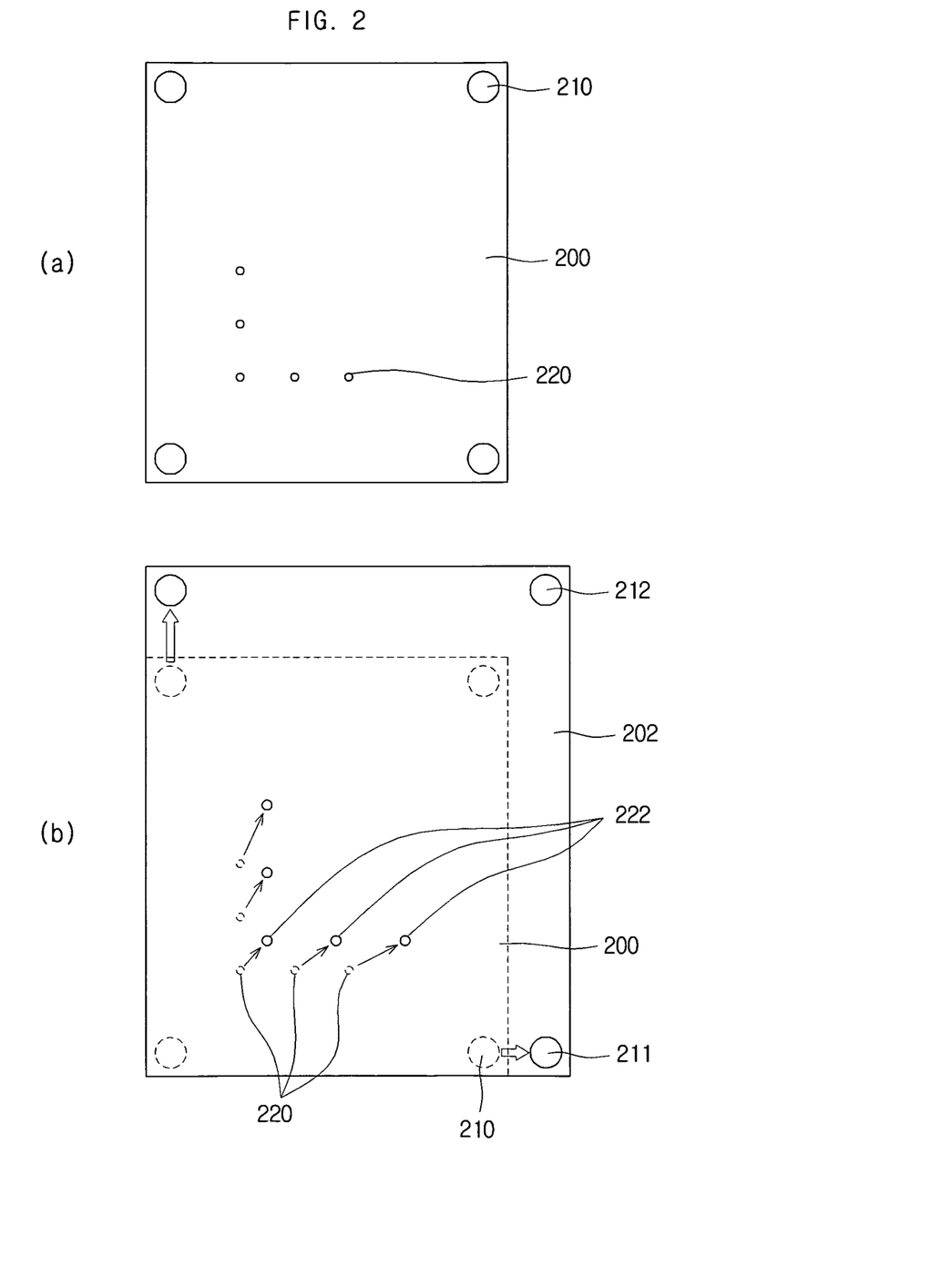
FIG. 2 is a front view of a substrate that undergoes shape compensation according to prior art.

FIG. 2 is a front view of a substrate that undergoes shape compensation according to prior art. In FIG. 2 are illustrated an insulation plate 200, 202, a fiducial mark 210, 212, a pad 220, 222.

Referring to FIG. 2(a), the shape of the insulation plate 200 in design data is shown. Referring to FIG. 2(b), the shape of the insulation plate 202 in manufactured result is overlapped on the shape of the insulation plate 200.

In this case, using the information of pad 220 in design data may not guarantee the electronic connection between via and pad.

There were some researches on linear scale compensation by measuring location of fiducial marks 210, 212 for improved via-pad conformity. Meanwhile, linear scale compensation on the information about limited numbers of fiducial marks can not deal with the complicated non-linear deformation of substrates that occurs during the manufacturing process.

SUMMARY

An aspect of the invention is to provide a printed circuit board manufacturing system and a manufacturing method thereof, providing improved process conformity by generating a control signal for via hole forming on a measured pad location information.

One aspect of the invention provides a method of manufacturing printed circuit board, comprising: providing a substrate that comprises a pad and an insulation layer covering the pad; acquiring an image of the substrate; acquiring location information of the pad by analyzing the image of the substrate; forming a via hole by removing a part of the insulation layer that corresponds the location information of the pad; and forming a via by filling the via hole with a conductive material.

Acquiring location information of the pad may comprises extracting a center coordinate of area that corresponds to the pad in the image of the substrate.

Forming the via hole comprises laser drilling process. Forming the via by laser drilling process may comprises generating a control signal for via hole forming based on the location information of the pad and applying laser to the part of the insulation layer that corresponds to the location information of the pad, considering the control signal.

Another aspect of the invention provides a printed circuit board manufacturing system, using a substrate that comprises a pad and an insulation layer covering the pad, comprising; an image sensor part for acquiring an image of the substrate, a control part for generating a control signal for via hole forming and a laser applying part for applying laser, considering the control signal, to the part of the insulation layer that corresponds to the location information of the pad.

Additional aspects and advantages of the present invention will be set forth in part in the description which follows, and in part will be obvious from the description, or may be learned by practice of the invention.

DETAILED DESCRIPTION

Embodiments of a printed circuit board manufacturing system and a manufacturing method thereof according to certain aspects of the invention will be described below in more detail with reference to the accompanying drawings. In the description with reference to the accompanying drawings, those components are rendered the same reference number that are the same or are in correspondence regardless of the figure number, and redundant explanations are omitted. Also, the basic principles will first be described before discussing the preferred embodiments of the invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
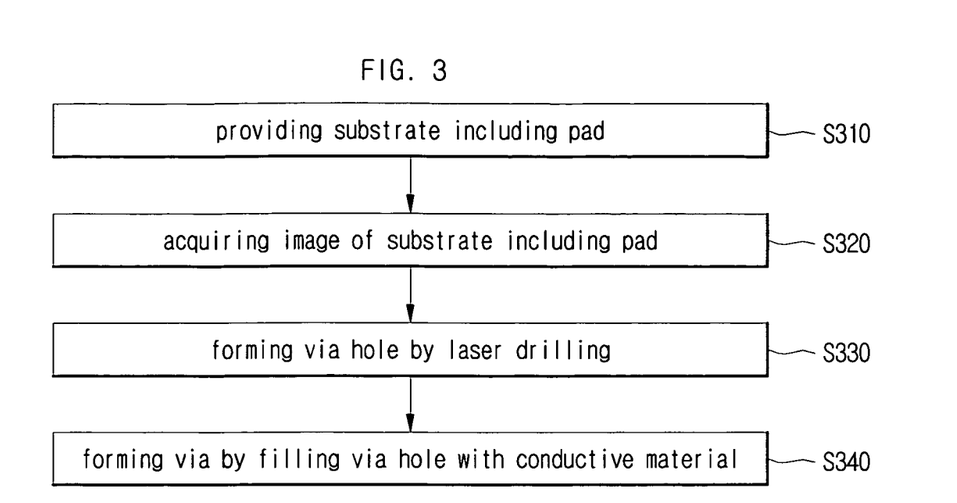
FIG. 3 is a diagram of printed circuit board manufacturing method according to a disclosed embodiment of the invention.
Figure 4:
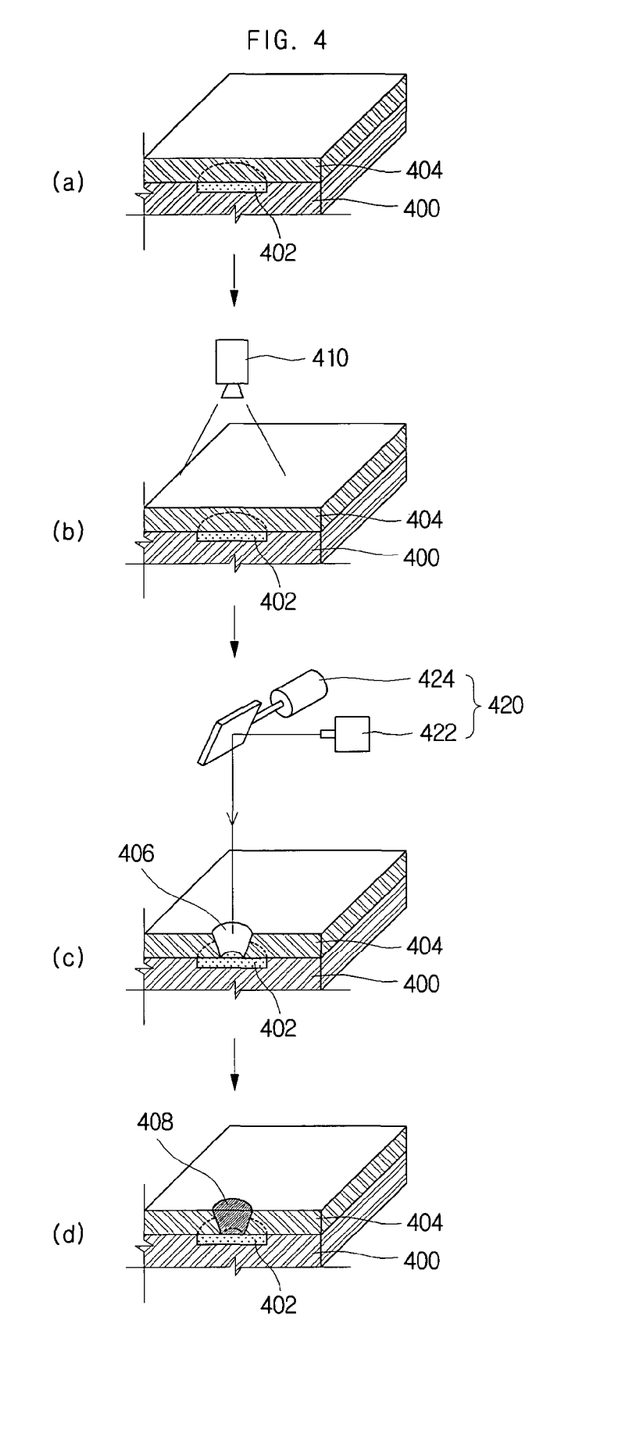
FIG. 4 is a flowchart of printed circuit board manufacturing method according to a disclosed embodiment of the invention.

FIG. 3 is a diagram of printed circuit board manufacturing method according to a disclosed embodiment of the invention. FIG. 4 is a flowchart of printed circuit board manufacturing method according to a disclosed embodiment of the invention. In FIG. 3 and FIG. 4, are illustrated a first insulation layer 400, a pad 402, a second insulation layer 404, a via hole 406, a via 408, an image sensor 410, a laser applying part 420, a laser source 422 and a galvanometer 424.

Providing substrate including pad S310 will be described, referring to FIG. 4(a). The first insulation layer 400 may be composed of polymer resin (polyimide, epoxy and the likes). The pad 402 is a part of circuit pattern formed in the first insulation layer 400. The pad 402 may be connected electronically to other circuit patterns formed in the first insulation layer 400.

The circuit pattern comprising the pad 402 may be formed by subtractive process and additive process. The subtractive process is patterning process by removing unnecessary part of conductive material applied on an insulation layer. The additive process is patterning process by non-electrical plating method applied on an insulation layer. The semi-additive process is patterning process using electrical plating process and etching process after non-electrical plating. In addition, pre-formed circuit pattern may be buried to the first insulation layer. The pattern may be composed of metal material as Cu and may have Au coating or Sn coating on it.

The second insulation layer 404 is covering the pad 402. The second insulation layer 404 may be formed by applying insulation material on the first insulation layer 400 comprising the pad 402. The second insulation layer 404 may be composed of same materials that composing the first insulation layer 400.

Meanwhile, a printed circuit board made by present embodiment may be multi-layered and there may be another insulation layer, comprising circuit pattern, under the first insulation layer 400.

Acquiring image of substrate including pad S320 will be described referring FIG. 4(b). the image of the substrate may be acquired by the image sensor 410 installed in front of the substrate.

For example, the image sensor 410 may be a CCD camera. Because that materials composing the first and the second insulation layer 400, 404 differ from materials composing the pad 402 in optical characteristics, the first and the second insulation layer 400, 404 may be distinguished from pad 402 in the image of the substrate. In addition, high transparency of the second insulation layer 404 for wavelength used by the image sensor 410 may provide relatively clear image.

The acquired image of the substrate may include information about circuit pattern including the pad 402. Then, defining an area about the pad 402, in the image of total circuit pattern image, may be required.

location information of the pad may be acquired by extracting center coordinate of the pad area, defined like this. For example, the center coordinate of the pad area may be extracted by converting the pad area to black and white image and calculating center of mass in the converted area.

In the step S320 the location of the pas 402 may be directly measured, not conjectured by scale compensation.

Meanwhile, a substrate may comprise a fiducial mark, and location information of the fiducial mark may be acquired from the image of the substrate. The location information of the fiducial mark may be an origin in the location information of the pad. Also, the location information of the fiducial mark may be an assistant information that identifies the align direction of the substrate.

Forming via hole by laser drilling S330 will be described referring FIG. 4(c). The via hole 406 is formed by applying laser to the second insulation layer 404, using the laser applying part 420 comprising the laser source 422 and the galvanometer 424.

As mentioned above, information about laser applying point may be acquired by analyzing the image of the substrate from the image sensor 410. This step S330 may improve conformity between the pad 402 and the via hole 406 by forming the via hole 406, using the measured location information of the pad.

A CO2 laser, a YAG laser and excimer laser may be used as a laser source in the present embodiment. Also, a pulse laser may be utilized for the laser source stability.

Forming via by filling via hole with conductive material S340 will be described referring FIG. 4(d). The via 408 may be formed by filling the via hole 406 with a conductive material.

The via 408 may be utilized to provide electrical connection to circuits on the substrate that will be formed in subsequent process and to form external electrode. In case that additional circuit pattern layer is formed on the substrate comprising the via 408, additional process forming a insulation layer covering the via 408 and process forming circuit pattern on the insulation layer may be required.

Conductive material filling process may be accomplished by electrical plating, screen printing and etc. the conductive material may be metal like Cu and Au, and conductive polymer. Conductive material comprising corrosion-resistive element like Ni may be utilized when the via 408 forms the external electrode.

Figure 5:
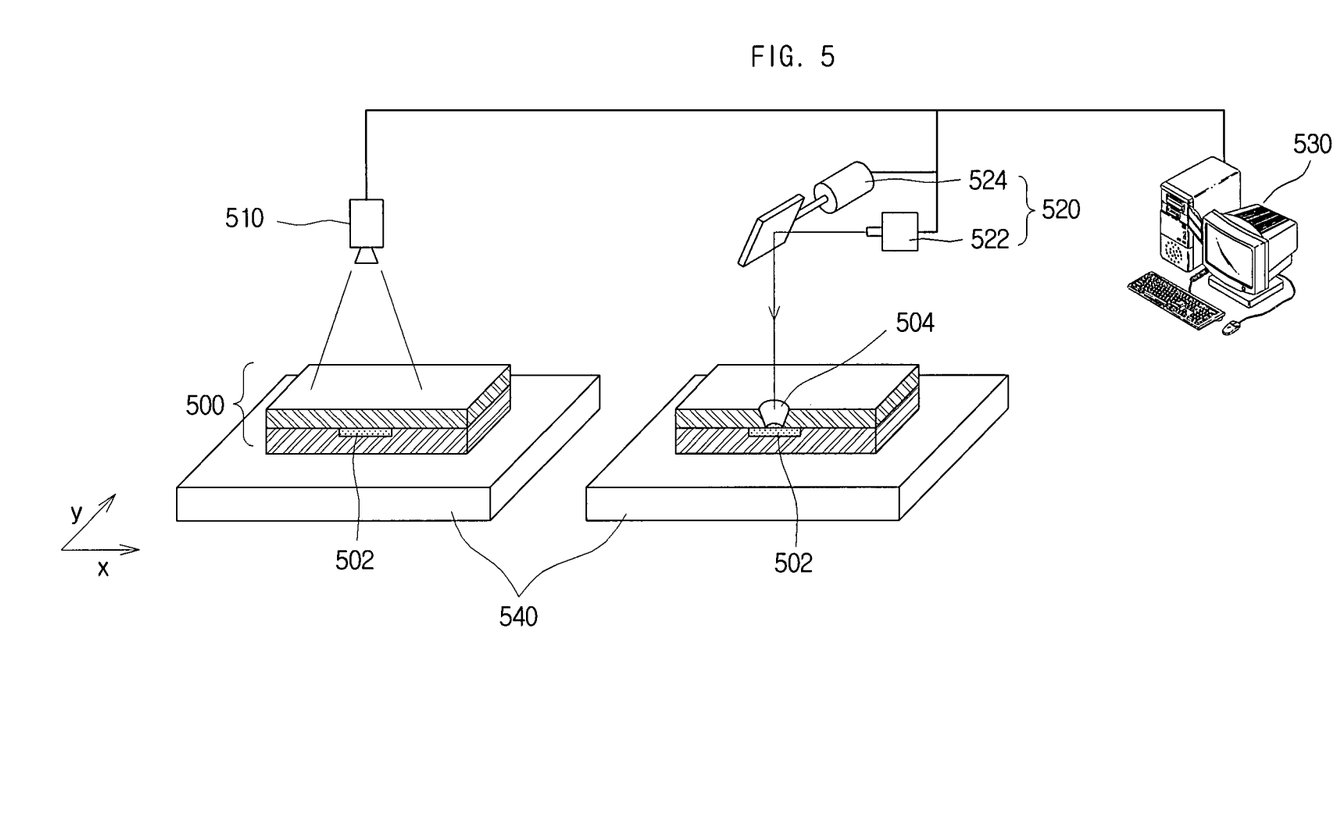
FIG. 5 is a schematic illustration of printed circuit board manufacturing system according to a disclosed embodiment of the invention.

FIG. 5 is a schematic illustration of printed circuit board manufacturing system according to a disclosed embodiment of the invention. In FIG. 5 are illustrated a substrate 500, a pad 502, a via hole 504, an image sensor part 510, a laser applying part 520, a control part 530 and a support part 540.

The image sensor part 510 acquires the image of the substrate including the pad and transfer the image to the control part. As mentioned above, the image sensor part 510 may be configured with a CCD camera.

Meanwhile, the wavelength utilized by the image sensor part may not be in visible light band. To distinguish the circuit pattern comprising the pad 502 form the insulation layer, infrared and x-ray band light may be applied to the substrate in image acquisition.

The control part 530 generates a control signal for via hole forming by analyzing the image from the image sensor part 510.

The location information of the pad 502 may be acquired by analyzing the image of the substrate. For this, the image processing mentioned above, referring to FIG. 3 and FIG. 4, may be accomplished.

The control signal for via hole forming may comprise a control signal for galvanometer angle control and a control signal for laser power control. Controlling the driving angle of the galvanometer, laser beam could be controlled. The laser power reduction, for outside of the via hole area, may prevent unnecessary removal of the insulation layer.

The laser applying part 520 may apply the laser to the substrate 500 according to the control signal for via hole forming from the control part 530. In this embodiment, the laser applying part 520 comprises the laser source 522 and the galvanometer 524.

The galvanometer 524 scans the laser in x-y directions on the substrate by controlling the angle of a reflection body coupled to a driving motor. The laser source generates laser beam that could remove the insulation layer of the substrate 500.

As mentioned above, the control signal for via hole forming comprises a control signal for angle control of the galvanometer 524 and a control signal for power control of the laser source 522.

Meanwhile, a laser applying part comprising a galvanometer is used in this embodiment and the configuration of optical system may be modified. For example, an optical system that moves a reflection body and a laser source in x-y plane may be configured.

Meanwhile, the printed circuit board manufacturing system 500 may comprise an image acquisition stage by the image sensor 510 and a laser process stage by the laser applying part 520. These two stages may handle different substrates simultaneously.

The support part 540 supports the substrate 500 during the processes. If necessary, the substrate 500 may be carried with the support part coupled.

Figure 6:
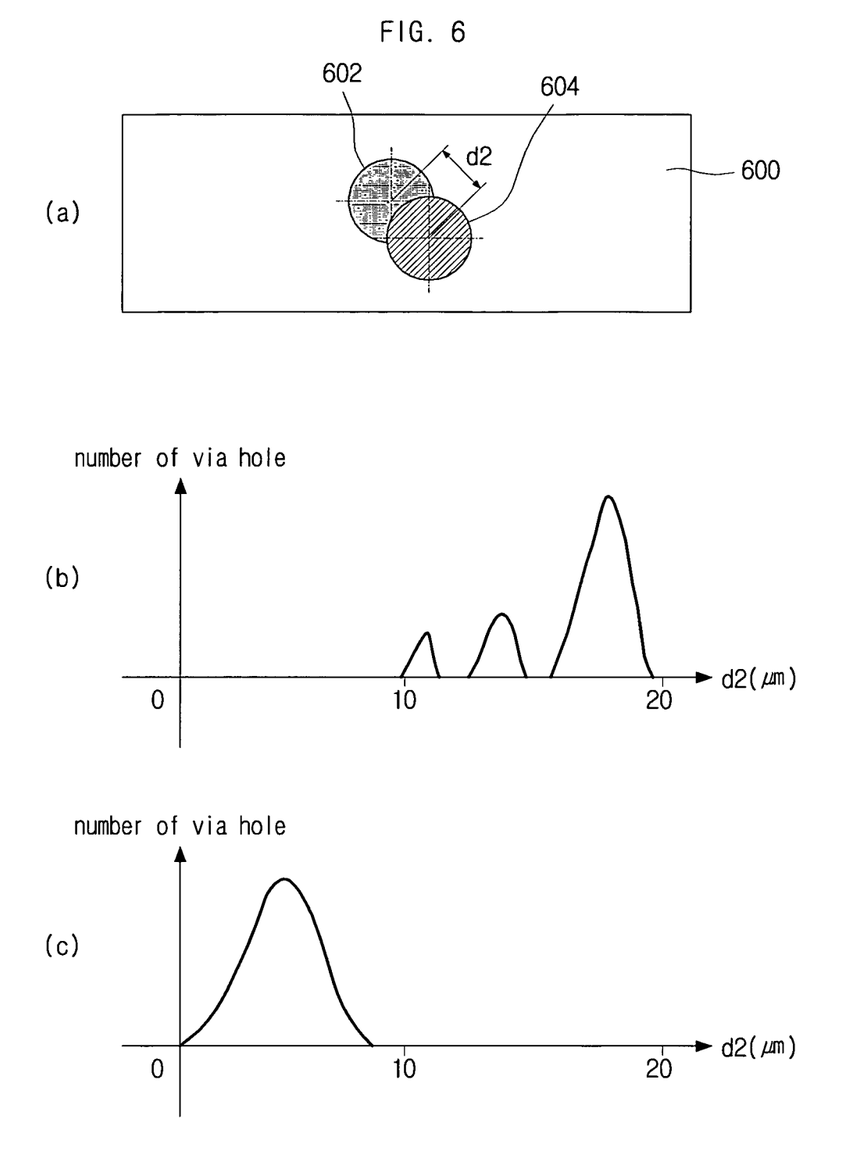
FIG. 6 is distribution illustrations of number of via holes to distance between real via hole and ideally conformed via hole according to prior art and a disclosed embodiment of the invention.

FIG. 6 is distribution illustrations of number of via holes to distance between real via hole and ideally conformed via hole according to prior art and a disclosed embodiment of the invention. In FIG. 6 are illustrated a substrate 600, an ideally conformed via hole 602 and a real via hole 604.

The ideally conformed via hole 602 is a perfectly conformed via hole to a pad on the substrate. The center location of the ideally conformed via hole 602 matches perfectly with the center location of the pad on the substrate. The real via hole 604 may be separated from the ideally conformed via hole 602, by distance d2, due to the errors in process.

FIG. 6(*b*) illustrates a distribution of number of the via holes to distance d2, according to prior art. FIG. 6(*c*) illustrates a distribution of number of the via holes to distance d2, according to a embodiment of the present invention.

Referring to FIG. 6(*b*), most via holes have separation distance larger than 10 micrometer. Meanwhile, Referring to FIG. 6(*c*), the separation distance remains smaller than 10 micrometer. Like this, the conformity between a via and a pad may be improved by considering measured pad location information for via hole forming process.

Meanwhile, FIG. 6(*c*) may be understood as an example, not limiting the benefit of the present invention.

According to certain embodiments of the invention as set forth above, the printed circuit board manufacturing system and a manufacturing method thereof may allow provides improved process conformity, even if the substrate has partial or nonlinear deformation, by considering the location information of the pad in the via hole forming. The improved conformity may allow more flexibility to substrate design and more integrity for circuitries on printed circuit board.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing a printed circuit board, comprising:

provide a substrate that comprises a first insulation layer having a pad and a second insulation layer covering the pad;

acquiring an image of the substrate by use of an image sensor;

analyzing the image of the substrate and acquiring location information of the pad covered by the second insulation layer, the acquiring the location information of the pad comprising defining an area of the pad in the image of the substrate, and extracting a center coordinate of the area of the pad that corresponds to the pad in the image of the substrate by converting the area of the pad to a black and white image and calculating a center of mass in the converted area;

forming a via hole by removing a part of the second insulation layer that corresponds to the acquired location information of the pad, the forming the via hole comprising using a laser drilling process and generating a control signal based on the location information of the pad; and forming a via by filling the via hole with a conductive material.

2. The method of claim 1, wherein the forming the via hole further comprises:

applying a laser to the part of the second insulation layer that corresponds to the acquired location information of the pad according to the control signal.

* * * * *